United States Patent
Im et al.

(10) Patent No.: US 7,094,712 B2
(45) Date of Patent: Aug. 22, 2006

(54) HIGH PERFORMANCE MIS CAPACITOR WITH $HFO_2$ DIELECTRIC

(75) Inventors: Ki-Vin Im, Seoul-si (KR); Ki-Yeon Park, Seoul-si (KR); Jae-Hyun Yeo, Bucheon-si (KR); In-Sung Park, Seoul (KR); Seung-Hwan Lee, Seoul (KR); Young-Sun Kim, Suwon-si (KR); Sung-Tae Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 128 days.

(21) Appl. No.: 10/793,818

(22) Filed: Mar. 8, 2004

(65) Prior Publication Data

US 2005/0070063 A1     Mar. 31, 2005

(30) Foreign Application Priority Data

Sep. 30, 2003 (KR) ................ 2003-67809
Feb. 23, 2004 (KR) ................ 2004-11765

(51) Int. Cl.
*H01L 21/31* (2006.01)

(52) U.S. Cl. ..................... 438/785; 438/778
(58) Field of Classification Search ............ 438/778, 438/785
See application file for complete search history.

(56) References Cited

U.S. PATENT DOCUMENTS 6,204,119 B1 * 3/2001 Lange et al. ............... 438/254
6,355,519 B1 * 3/2002 Lee ........................... 438/250
6,858,524 B1 * 2/2005 Haukka et al. ............. 438/585
2002/0197856 A1 * 12/2002 Matsuse et al. ............. 438/652
2005/0136689 A9 * 6/2005 Vaartstra .................... 438/785

FOREIGN PATENT DOCUMENTS

KR     2001-97163     11/2001

* cited by examiner

*Primary Examiner*—Bradley K. Smith
(74) *Attorney, Agent, or Firm*—Harness, Dickey & Pierce

(57) ABSTRACT

Disclosed is a method for forming metal oxide dielectric layers, more particularly $HfO_2$ dielectric layers, using an atomic layer deposition (ALD) method in which a series of thin intermediate layers are formed and treated with one or more oxidizers and nitrogents before the next intermediate layer is formed on the substrate. The intermediate oxidation treatments reduce the number of organic contaminants incorporated into the metal oxide layer from the organometallic precursors to produce a dielectric layer having improved current leakage characteristics. The dielectric layers formed in this manner remain susceptible to crystallization if exposed to temperatures much above 550° C., so subsequent semiconductor manufacturing processes should be modified or eliminated to avoid such temperatures or limit the duration at such temperatures to maintain the performance of the dielectric materials.

27 Claims, 14 Drawing Sheets

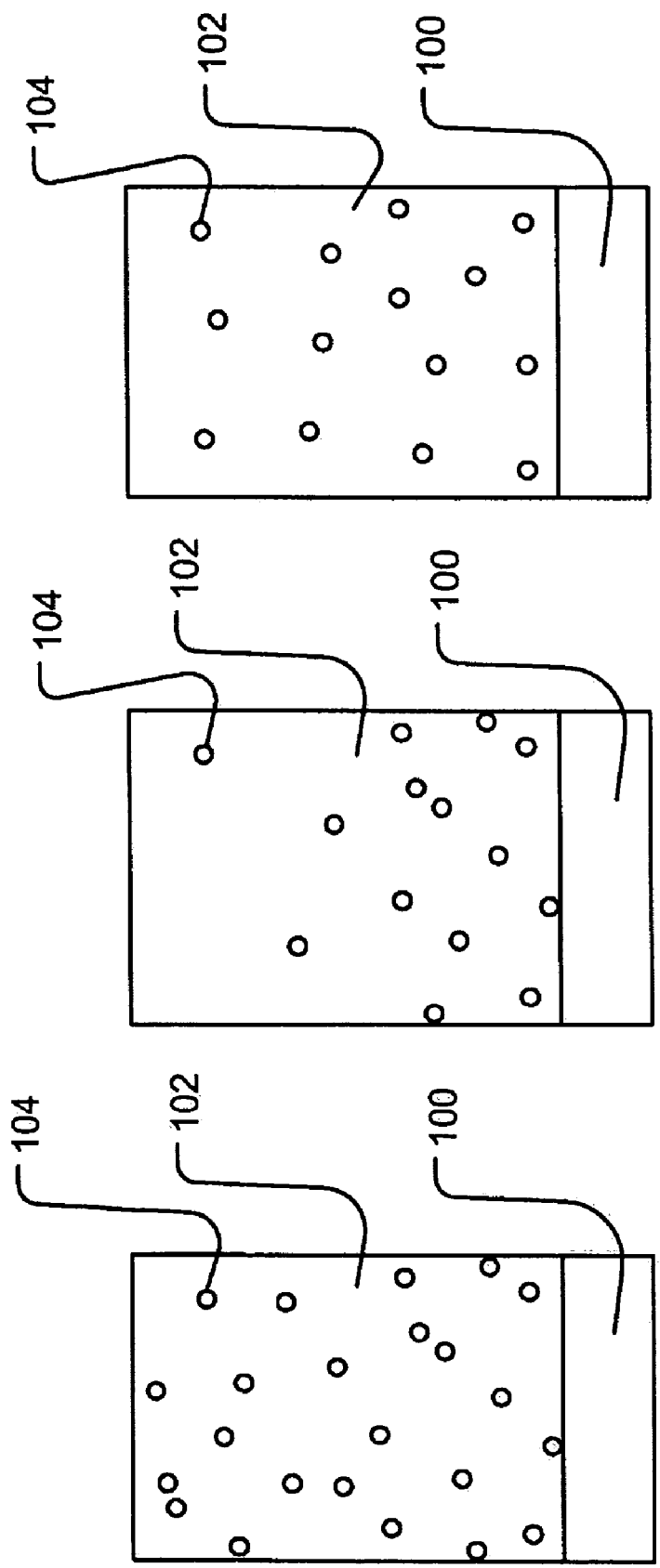

HIGH PERFORMANCE MIS CAPACITOR WITH HFO₂ DIELECTRIC

CROSS-REFERENCE TO RELATED CASES

This U.S. nonprovisional patent application claims priority under 35 U.S.C. § 119 of Korean Patent Application 2003-67809 filed on Sep. 30, 2003 and Korean Patent Application 2004-11765 filed on Feb. 23, 2004, the entire contents of which are hereby incorporated by reference.

BACKGROUND OF THE INVENTION

1. Field of the Invention

The present invention relates to an improved method for manufacturing semiconductor devices, and more particularly, to an improved atomic layer deposition (ALD) method for forming thin, high-quality $HfO_2$ layers suitable for use as a dielectric material in such semiconductor devices.

2. Description of the Related Art

As the scale of semiconductor devices has decreased, the need for ultra-thin layers has gradually increased. However, the formation of ever thinner layers necessitates other process adjustments such as lower thermal budgets and the use of new materials. In addition to the thermal budget concerns, as the size of contact holes and other structural elements are decreased, problems associated with step coverage and loading effects tend to increase. Atomic layer deposition (ALD) methods have been proposed as a means for overcoming various problems resulting from the increased integration of semiconductor devices.

The basic ALD technique enables a material layer to be grown to a desired thickness by repeatedly forming very thin (i.e., atomic) layers of a desired material using two types of reactants sequentially applied to a reaction chamber. ALD techniques obtain an AB material layer by reacting minute quantities of two reactants, AX(g) and BY(g), on the surface of a substrate. The thickness of the AB material layer is increased by repeating the sequential supply and reaction of the AX(g) and BY(g) reactants generating XY(g) as a by-product. The deposition reaction can be generally represented by Formula I.

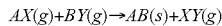

$$AX(g) + BY(g) \rightarrow AB(s) + XY(g) \qquad \text{I}$$

More specifically, in an ALD process, a first reactant, AX(g), is supplied to a reactor chamber which a semiconductor substrate, such as a wafer, is provided. The first reactant AX(g) may be referred to as a "precursor" and is a compound obtained by combining an element A that will be used to form the desired AB material layer with another element or elements X. The first reactant AX(g), supplied to the reactor, may react with a surface of the substrate, or be chemically or physically adsorbed by the surface of the substrate. Here, since the absorption reaction can be regarded as the actual reaction, the first reactant layer of the chemically absorbed AX (or chemisorbed) is formed on the atomic-size level.

Next, the non-chemisorbed portion of first reactant AX(g) is removed from inside the reactor. This removal may be performed using vacuum exhausting or vacuum pumping. Alternatively, the vacuum exhaust process may comprise purging the reactor with an inert gas such as $N_2$ or Ar. The purge cycle will remove substantially all of the physically-absorbed AX from the substrate and flush it, as well as any remaining non-absorbed first reactant AX(g) from the chamber. As a result, only the chemisorbed or reacted AX layer remains on the substrate.

A second reactant BY(g) is then supplied to the reactor. The second reactant B Y(g), which may also be referred to as a "precursor," is a compound obtained by combining an element B necessary to form the desired AB material layer with an element or elements Y. A portion of the second reactant BY(g) reacts with the chemisorbed layer of AX according to Equation I, thereby forming a thin "atomic" AB(s) layer on the substrate and generating the by-product XY(g). The non-reacted portion of the second reactant BY(g) and the reaction by-product XY(g) are then removed from the reactor, typically by vacuum exhausting and/or purging with an inert gas.

The resulting AB(s) layer is formed roughly on the atomic-size level and is, therefore, not more than a few molecules thick. Accordingly, to form the AB material layer having the desired thickness, the cycle of supply, exhaustion, and purging of the AX(g) and BY(g) reactants is typically repeated several times.

Of particular interest in the quest for ever thinner and high-quality are the capacitive dielectric layers that are conventionally employed as gate dielectric layers within field effect transistors (FETs) and capacitor plate separation dielectric layers used in various types of microelectronic fabrications, including, for example, the production of highly integrated semiconductor devices. The capacitance of a structure may be determined using Formula II:

$$C = \epsilon_{in} \cdot A / T_{in} \qquad \text{II}$$

where C is the capacitance, $\epsilon_{in}$ is the dielectric constant of the dielectric material, A is the surface area of the capacitor and $T_{in}$ is the thickness of the dielectric material. As reflected in this formula, as the area available for use as a capacitor is decreased in more highly integrated devices, the dielectric constant must increase and/or the thickness of the dielectric layer must decrease accordingly to maintain a similar level of capacitance.

While thinner dielectric layers are generally desirable in the search for improved performance of the capacitive structures used in semiconductor devices, the need for integrity, uniformity and dielectric strength in the dielectric layers can present significant technical barriers to the successful production of such materials. Traditional dielectric materials have included silicon oxides, silicon nitrides, silicon oxynitrides and composites or stacked structures of two or more such materials such as oxide-nitride-oxide (ONO) dielectrics.

These traditional dielectric materials, however, have a relatively low dielectric constant, typically between about 4 and 8, that limits the capacitance that can be obtained with layers being thick enough to maintain sufficient integrity. A number of alternative materials including a range of metal oxides, sometimes called high-k materials, typically having dielectric constants greater than 10, have been investigated and/or utilized to provide improved capacitive performance while allowing the use of thicker material layers. Silicon oxide is commonly used as a standard for comparing the performance of other dielectric materials whereby the thickness of an equivalent silicon oxide layer, i.e., the $T_{oxeq}$, is calculated according to the Formula III:

$$T_{oxeq} = \epsilon_{ox} / \epsilon_{in} T_{in} \qquad \text{III}$$

in which $\epsilon_{ox}$ is the dielectric constant of silicon dioxide, $\epsilon_{in}$ is the dielectric constant of the alternative dielectric(s) being used to form the capacitor and Tin is the thickness of the dielectric constant material.

While these alternative high-k dielectric materials such as metal oxides and metal-silicon oxides can be useful as high-performance dielectric materials, it has proven challenging to obtain such layers having sufficient purity and integrity using traditional chemical vapor deposition (CVD) methods employing organometallic precursors, i.e., compounds that contain both metal and carbon, as the source materials for the metal portion of the desired metal oxide because of the likelihood of contamination in the resulting material layers. In particular, capacitors incorporating such dielectric materials tend to suffer from carbon contamination resulting from residues of the organic portion of the organometallic precursor molecule that may degrade the leakage current characteristics of the resulting device.

One prior art solution to the problem of carbon contamination in metal oxide films is to follow the formation of the metal oxide film with an anneal process, generally in combination with a supplemental oxygen source, to "burn-off" the carbon contamination. Such a technique is disclosed in U.S. Pat. No. 6,395,650, the contents of which are incorporated herein by reference, in its entirety, in which the metal oxide film is irradiated with an ultraviolet radiation source such as an ultraviolet laser, an ultraviolet lamp or an ultraviolet plasma radiation source. Although the use of such methods may reduce the level of carbon contamination within the film, these methods also tend to increase the degree of crystallization within the metal oxide film, thereby creating potential alternative leakage paths along the grain boundaries.

SUMMARY OF THE INVENTION

Disclosed is a method for forming a hafnium oxide layer on a substrate comprising positioning the substrate in a vacuum chamber, forming a first atomic scale hafnium oxide layer by introducing an organic hafnium precursor into the vacuum chamber under conditions sufficient to form a chemisorbed layer of the organic hafnium precursor on the substrate, removing substantially all of the organic hafnium precursor not included in the chemisorbed layer from the chamber, introducing a first oxidant into the vacuum chamber under conditions sufficient to cause the first oxidant to react with the chemisorbed layer to form hafnium oxide and reaction byproducts, purging the vacuum chamber to remove substantially all remaining first oxidant and a major portion of the reaction byproducts. The organic hafnium precursor is advantageously introduced into the vacuum chamber at a pressure of about 0.1–10 torr and a temperature of about 200–400° C.

The reaction conditions may include pressures of about 0.1–10 torr and temperatures of between about 200 and 400° C.

The thickness of the resulting hafnium oxide layer may be increased by repeatedly introducing the organic hafnium precursor into the vacuum chamber under conditions sufficient to form a chemisorbed layer of the organic hafnium precursor on a previous atomic scale hafnium oxide layer, purging the reaction chamber to remove substantially all of the organic hafnium precursor not included in the chemisorbed layer, introducing the first oxidant into the vacuum chamber under conditions sufficient to cause the first oxidant to react with the chemisorbed layer to form hafnium oxide and reaction byproducts, purging the vacuum chamber to remove substantially all unreacted first oxidant and a major portion of the reaction byproducts to produce a hafnium oxide layer of thickness t including n atomic scale hafnium oxide layers, wherein n is at least 4.

Once a hafnium oxide layer has been from the atomic scale hafnium oxide layers (usually at least 4), the hafnium oxide layer may be treated with a second oxidant for a first flush period sufficient to reduce the level of organic contamination throughout substantially the entire thickness t of the hafnium oxide layer. Preferably, the first flush period is at least about 60 seconds. This process may be repeated as desired to form one or more additional hafnium oxide layers on the initial hafnium oxide layer.

An organic hafnium precursor useful in practicing this method is tetrakis ethyl methyl amino hafnium (TEMAH) and the first and second oxidants may include one or a mixture of compounds selected from $O_3$, $O_2$, $H_2O$, $H_2O_2$, $CO_2$, $N_2O$, $NO_2$, plasma $O_2$, remote plasma $O_2$, plasma $O_3$, UV-$O_3$ and remote plasma $O_3$.

The first and second oxidants may be the same or different and may be introduced into the reaction chamber under similar or different reaction conditions of flow rate, temperature and pressure. The hafnium oxide layer may also be treated with a third oxidant or a nitrogent for a second flush period, typically after purging the reaction chamber to remove residual gases from previous steps. The reaction conditions may include pressures of about 0.1–10 torr and temperatures of between about 200 and 400° C.

Also disclosed is a method of forming a capacitor utilizing a hafnium dioxide dielectric comprising forming a bottom electrode, forming a barrier layer on the bottom electrode, forming a hafnium oxide layer utilizing the formation method described above, and forming a top electrode to complete the capacitor. Forming a capacitor may also include nitriding a surface portion of the bottom electrode to provide a barrier layer before forming the hafnium oxide layer and the nitriding may be achieved using a rapid thermal process. The top electrode may comprise a stacked structure including a titanium nitride layer formed on the hafnium oxide layer and a tungsten layer formed on the titanium nitride layer.

Also disclosed is a method of manufacturing a semiconductor device that includes a capacitor having a hafnium dioxide dielectric produced according to the method described above and limiting the temperatures utilized during subsequent processing to avoid crystallization of the hafnium oxide layer. This will typically require ensuring that the hafnium dioxide dielectric is not exposed to temperatures much above about 500° C. and, if exposed to such temperatures, the exposure is of short duration to limit the crystallization.

The top electrode may include a titanium nitride layer formed by atomic layer deposition using $TiCl_4$ and $NH_3$ as reactant gases at a temperature of about 450° C. and then forming a tungsten layer on the titanium nitride layer. The top electrode may also include a silicon-germanium capping layer formed on the titanium nitride layer using $SiH_4$ and $GeH_4$ as reactant gases using a CVD process operating at about 420° C.

BRIEF DESCRIPTION OF THE FIGURES

These and other objects, features and advantages of the present invention will be readily understood with reference to the following detailed description thereof provided in conjunction with the accompanying drawings, wherein the same reference numerals designate corresponding structural elements, and, in which:

FIGS. 3A–C illustrate the presence and movement of carbon within an ALD film both as deposited and after oxidation treatment and an anneal;

These drawings are provided for illustrative purposes only and are not drawn to scale. The spatial relationships and relative sizing of the elements illustrated in the various embodiments may have been reduced or expanded to improve the clarity of the figure with respect to the corresponding description. The figures, therefore, should not be interpreted as reflecting the relative sizing or positioning of the corresponding structural elements or the duration or intensity of process steps that could be encompassed by an actual device manufactured according to the exemplary embodiments of the invention.

DETAILED DESCRIPTION OF EXEMPLARY EMBODIMENTS

Figure 1:
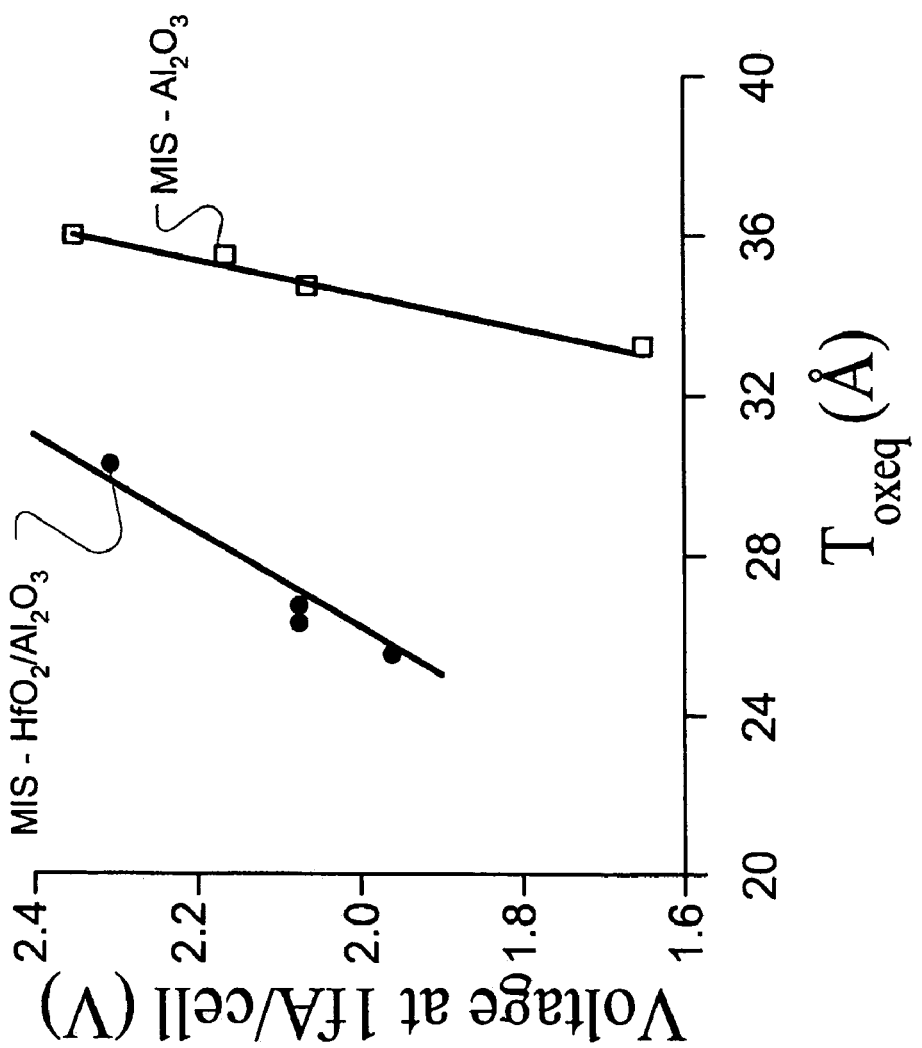
FIG. 1 illustrates the scalability of capacitors using a $Al_2O_3$ dielectric and capacitors using a $HfO_2/Al_2O_3$ dielectric.

Hafnium oxide, $HfO_2$, has been identified as a promising dielectric material when used either singly or in combination with other insulating materials such as alumina $Al_2O_3$. A combination of $HfO_2$ and $Al_2O_3$, when used as the dielectric layer in a metal-insulator-silicon (MIS) capacitor produces a lower $T_{oxeq}$ than a MIS capacitor using a single $Al_2O_3$ film. As reflected in FIG. 1, the combination of $HfO_2$ and $Al_2O_3$ as the dielectric film in a MIS capacitor shows improved scaling characteristics compared with the use of $Al_2O_3$ alone.

Figure 2:
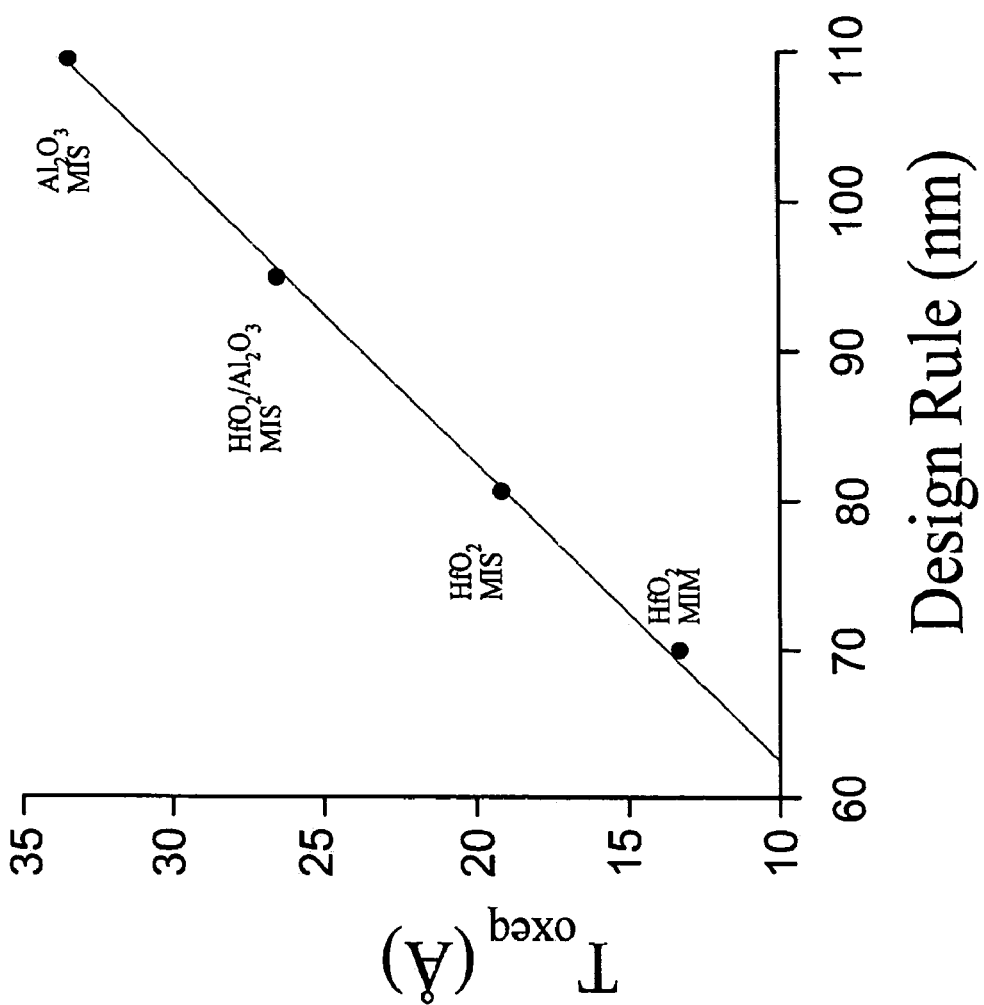
FIG. 2 illustrates the relationship between the design rule, the capacitor dielectric and the resulting $T_{oxeq}$.

As reflected in FIG. 2, for devices built to design rules below about 110 nm, $Al_2O_3$ should be replaced by a combination of $HfO_2$ and $Al_2O_3$. As also reflected in FIG. 2, for devices built to design rules below about 90 nm, the combination of $HfO_2$ and $Al_2O_3$ should, in turn, be replaced by a $HfO_2$ film in either a MIS or a metal-insulator-metal (MIM) configuration to obtain even lower $T_{oxeq}$ values.

A single $HfO_2$ layer, however, may be subject to degraded performance, particularly increased leakage current, as a result of crystallization and/or carbon contamination within the film. As illustrated in FIG. 3A, as deposited, $HfO_2$ films prepared from an organometallic precursor will typically include carbon contaminants 104 distributed somewhat evenly throughout the thickness of the film as illustrated in FIG. 3A. Oxidation treatments, typically using one or a mixture of compounds selected from $O_3$, $O_2$, $H_2O$, $H_2O_2$, $CO_2$, $N_2O$, $NO_2$, plasma $O_2$, remote plasma $O_2$, plasma $O_3$ and remote plasma $O_3$ have been used to treat contaminated $HfO_2$ films by converting the carbon contaminants into volatile byproducts such as $CO_2$ and $H_2O$ that can be more easily removed from the film and evacuated from the treatment chamber. The effects of these techniques, however, is limited by the mass transport in the $HfO_2$ film and are, therefore, generally confined to the upper portions of the film and permit carbon contaminants to remain in the film, particularly in the lower portion of the film near the electrode interface in a capacitor structure as illustrated in FIG. 3B. Further, additional thermal processing will tend to redistribute the carbon contaminants remaining in the $HfO_2$ film as illustrated in FIG. 3C and tend to decrease the performance of the resulting capacitor, particularly with respect to leakage current.

Figure 4:
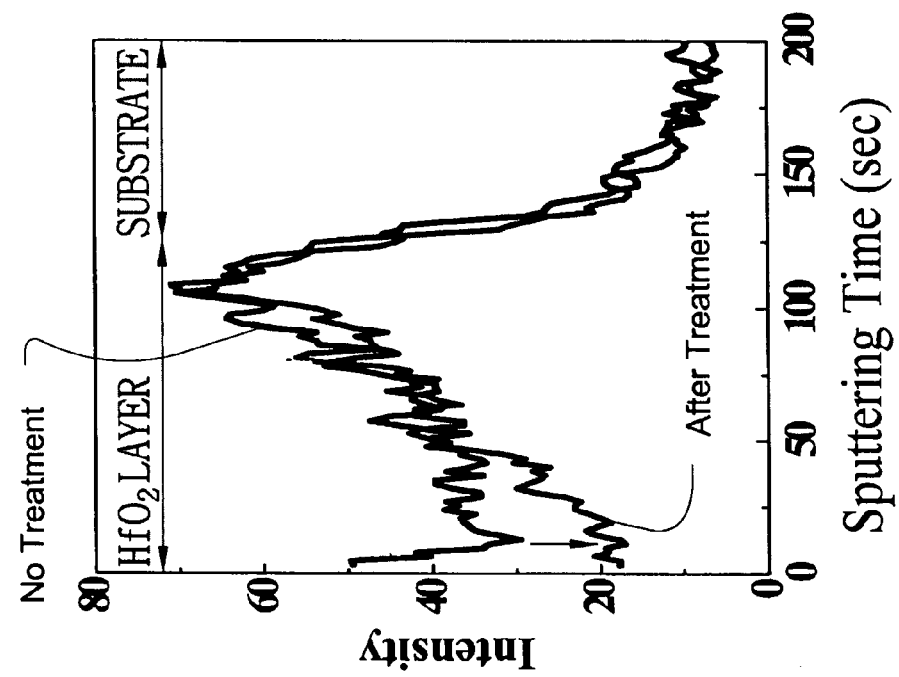
FIG. 4 illustrates the carbon concentration in a HfO2 layer as deposited and after receiving an oxidation treatment.

The carbon distribution in a $HfO_2$ film as-deposited, corresponding generally to FIG. 3A, and after oxidation treatment, corresponding generally to FIG. 3B, is reflected in FIG. 4 with the data for the surface portion of the film being oriented to the left. As reflected in the two traces, the carbon concentration is reduced near the surface by the oxidation treatment, but the carbon contaminants found in the lower portions of the $HfO_2$ film remain largely untouched. The arrow in FIG. 4 shows that carbon contaminants are reduced near surface.

Figure 5A:
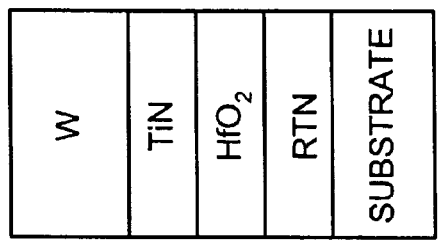
FIGS. 5A–B illustrate a conventional capacitor structure and an exemplary capacitor structure in accord with the present invention.

Test capacitors were prepared using a capacitor structure as illustrated in FIG. 5A with a polysilicon lower electrode, a rapid thermal nitridation (RTN) barrier layer formed on the electrode, a $HfO_2$ layer of approximately 65 Å, a TiN layer formed on the $HfO_2$ layer and finally a tungsten layer formed on the TiN. The leakage current of the resulting devices were measured both before and after the oxidation treatment. As reflected in FIG. 4, the oxidation treatment lowered the leakage current at most voltages by at least an order of magnitude.

This improvement in the leakage current performance, however, may only be temporary if the capacitor is later subjected to high temperature processing. As reflected in FIG. 6, even when the post-treatment capacitor initially demonstrates improved leakage current performance illustrated in FIG. 5, subsequent anneals at temperatures above about 500° C. may increase the leakage currents by several orders of magnitude and should, therefore, be reduced or eliminated for devices incorporating a $HfO_2$ dielectric. Evaluation of exemplary capacitors suggests that in some instances dielectric films prepared according to the disclosed methods, particularly $HfO_2$ films subjected to layer oxidation treatment (LOT) processing of more than one minute with $O_3$ may exhibit sufficient stability to tolerate excursions to temperatures of 550° C. or even 580° C. without suffering unacceptable leakage current.

Figure 5B:
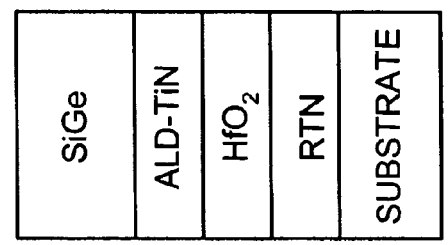
Figure 6B:
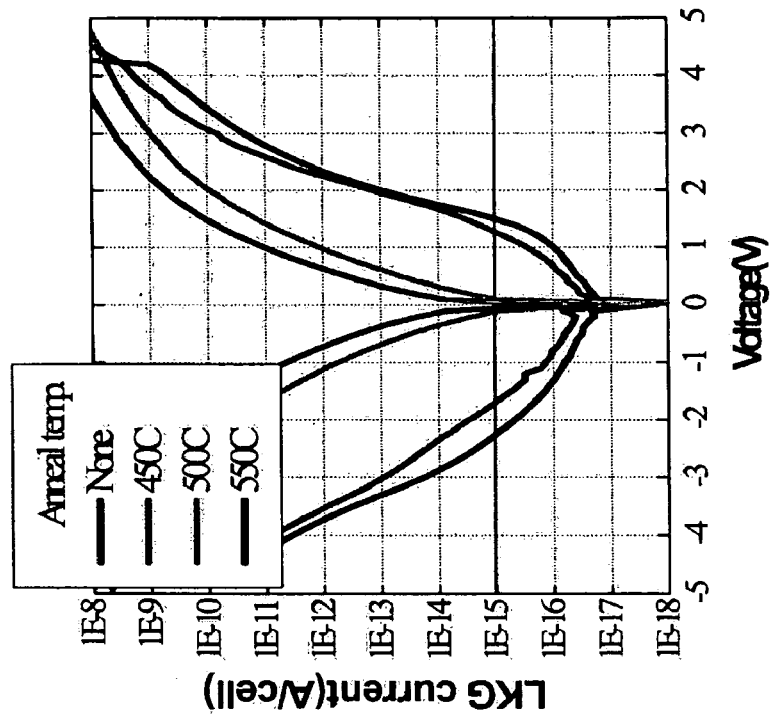
FIGS. 6A–B illustrate the improved leakage performance obtained by oxidation treatment of the deposited layer and the detrimental effects of a subsequent high temperature anneal.
Figure 6A:
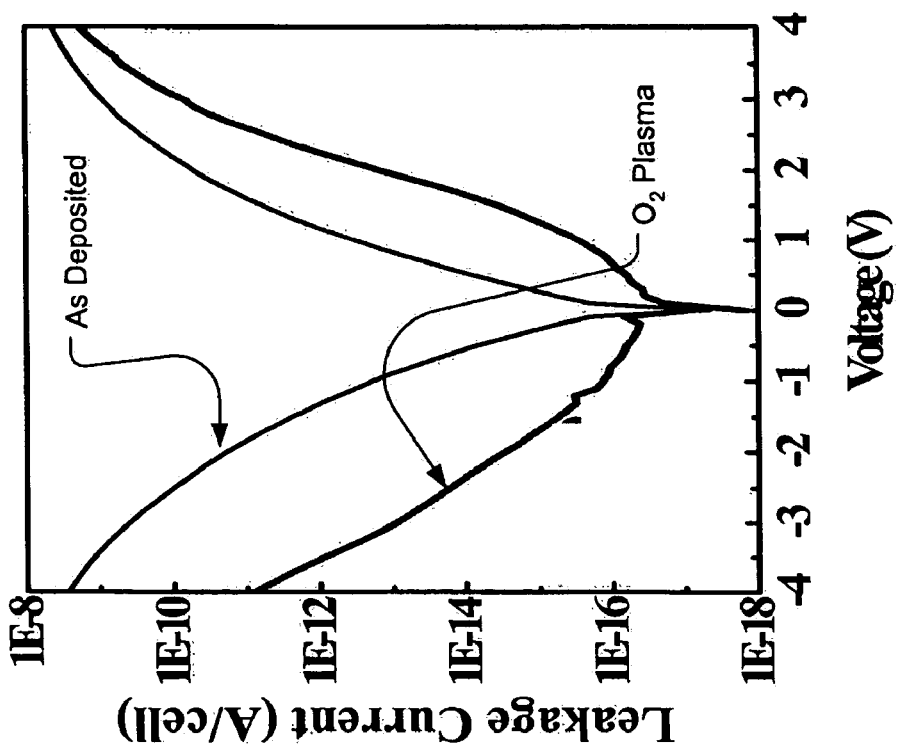

The present invention, however, produces a $HfO_2$ layer having improved purity and reduced crystallization adopting layer oxidation treatment (LOT). Although $HfO_2$ layers formed on a lower electrode in this manner may be covered with a top electrode, such as a conventional CVD TiN/polysilicon electrode, the elevated temperatures associated with such processes including post activation annealing the improvements in the capacitor performance are better maintained by replacing the conventional electrode structure with an atomic layer deposition (ALD) process for forming TiN and a polysilicon-germanium top electrode as illustrated in FIG. 5B.

The ALD-TiN/SiGe electrode may be successfully deposited at temperatures around 450° C. and 420° C. respectively, thus avoiding temperatures that would tend to degrade the performance of the resulting transistor. It appears that by utilizing a HfO$_2$ MIS capacitor, it will be possible to extend the T$_{oxeq}$ to values as low as about 20 Å.

A series of MIS capacitors using a HfO$_2$ dielectric film were fabricated on cylindrical phosphorus-doped polysilicon substrates. Before depositing the HfO$_2$, the polysilicon was nitridated using a conventional rapid thermal nitridation (RTN) process. The HfO$_2$ film was deposited with an ALD process using the hafnium organometallic precursor Tetrakis Ethyl Methyl Amino Hafnium (TEMAH) and ozone O$_3$ as the oxidant. The two reactant gases were separately supplied through shower head distributor onto the substrate which was maintained at approximately 300° C. during the deposition. In order to reduce the level of residual carbon and carbon compounds, the deposited HfO$_2$ films were treated with an O$_2$ plasma at 250° C. and LOT processing using O$_3$ flushing between the deposition of successive thin HfO$_2$ layers, including n atomic scale hafnium oxide layers wherein n is at least about 4, having a thickness generally less than about 10 Å.

The degree of carbon contamination remaining in the HfO$_2$ layer as a function of the duration of the LOT oxidation step was evaluated with oxidation steps of both 1 minute and 5 minutes compared against an untreated ALD HfO$_2$ film. As reflected in FIG. 7A, an oxidation treatment of 1 minute was sufficient to reduce the carbon contamination within the film and an oxidation treatment of 5 minutes reduced the carbon contamination to a level only slightly above that of the substrate.

Figure 7B:
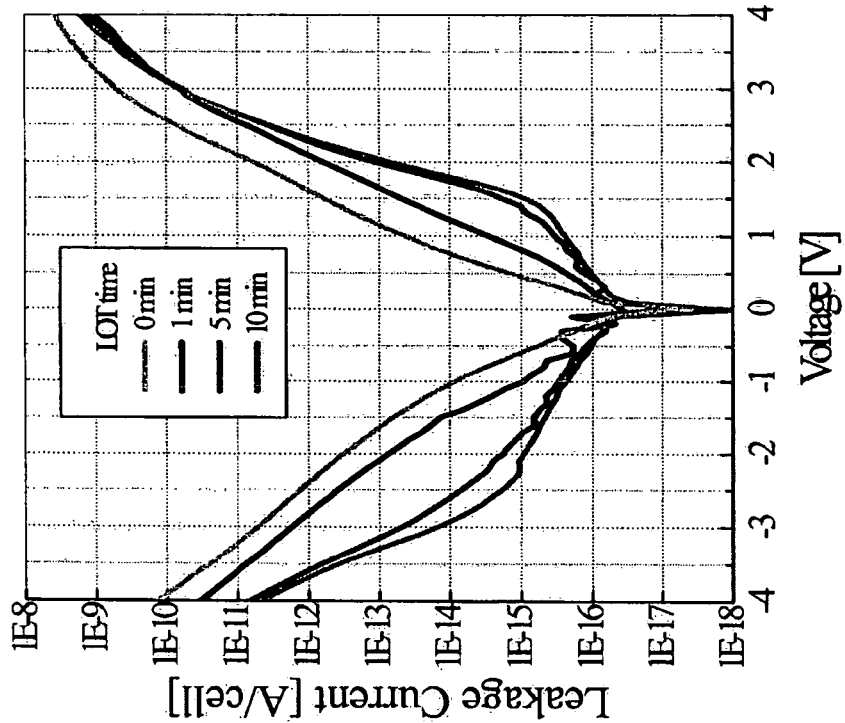
FIGS. 7A–B illustrate the leakage current as a function of the duration of the oxidizer treatment according to exemplary embodiments of the invention.
Figure 7A:
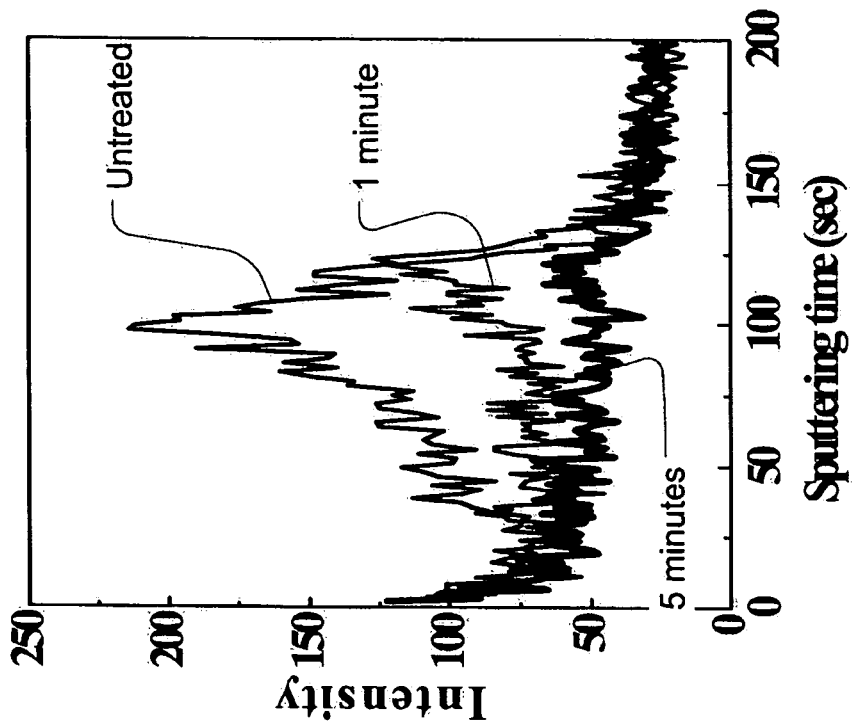

A series of capacitors manufactured with HfO$_2$ dielectrics that had received oxidation treatments of varying duration was also evaluated with the results provided in FIG. 7B. As reflected in the data presented in FIG. 7B, an oxidizing treatment with O$_3$ of one minute resulted in a capacitor that, although improved, had leakage current levels on the order of these exhibited by conventional untreated HfO$_2$ films. An oxidation treatment of five minutes provided additional improvements in the leakage current levels of the resulting capacitors, while an additional five minutes of oxidizing treatment produced little additional improvement. In balancing the interest maintaining throughput and improving the quality of the resulting capacitors, it appears that the intermediate layers of HfO$_2$ should be subjected to an additional LOT process of between about one minute and five minutes in order to obtain an improved dielectric layer.

Figure 10:
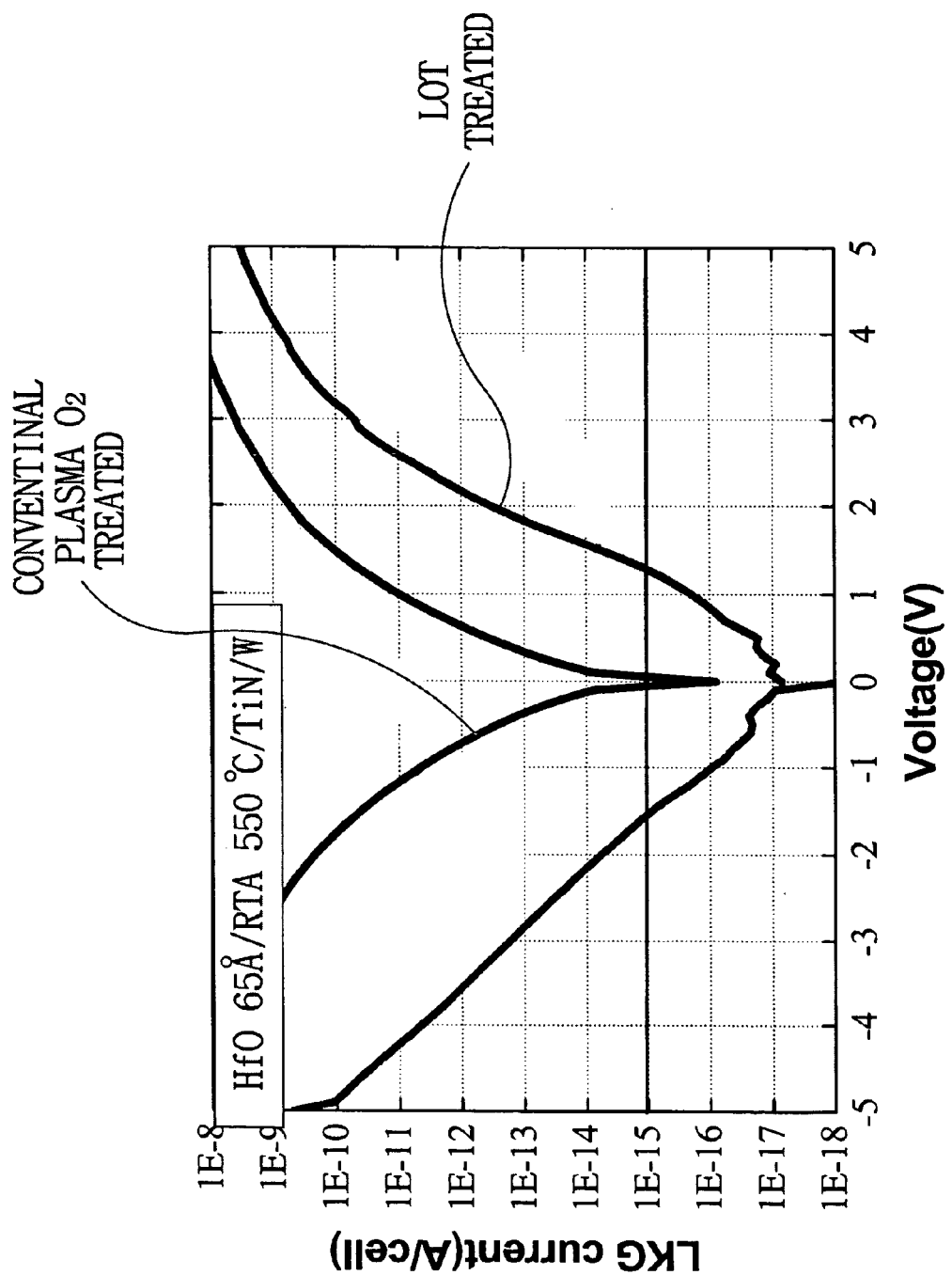
FIG. 10 illustrates the current leakage improvements seen in capacitors prepared according to exemplary embodiments of the invention and a conventional $O_2$ plasma treatment.

FIG. 10 illustrates the I–V characteristics of HfO$_2$ MIS with conventional plasma O$_2$ treatment and LOT followed by 550C RTA 2 min thermal budget. It illustrates that the leakage current of HfO$_2$ capacitor treated by LOT is superior to that of conventional plasma O$_2$ treatment.

Figure 11:
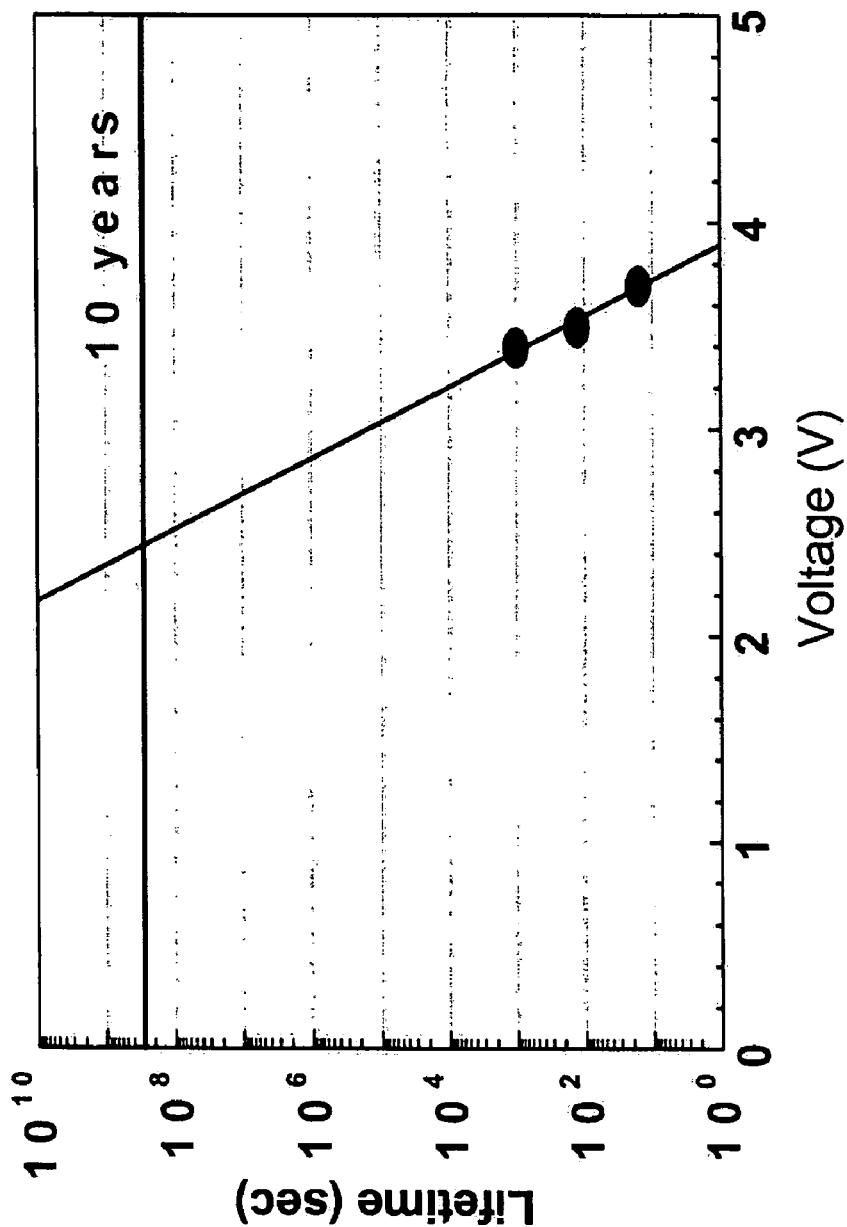
FIG. 11 illustrates the anticipated lifetime of semiconductor devices incorporating an exemplary dielectric according to the present invention.

Device performance was also evaluated using an exemplary HfO$_2$ dielectric prepared according to the exemplary methods for DRAM capacitors being manufactured to 80 nm design rules. These exemplary devices were then evaluated for time dependent dielectric breakdown (TDDB) performance at a range of voltages for the reliability of the device. As reflected in FIG. 11, devices prepared according to the exemplary embodiments exhibit a TDDB at 2.5 V of about 10 years with the lifetime improved even further at lower voltages.

Figure 8:
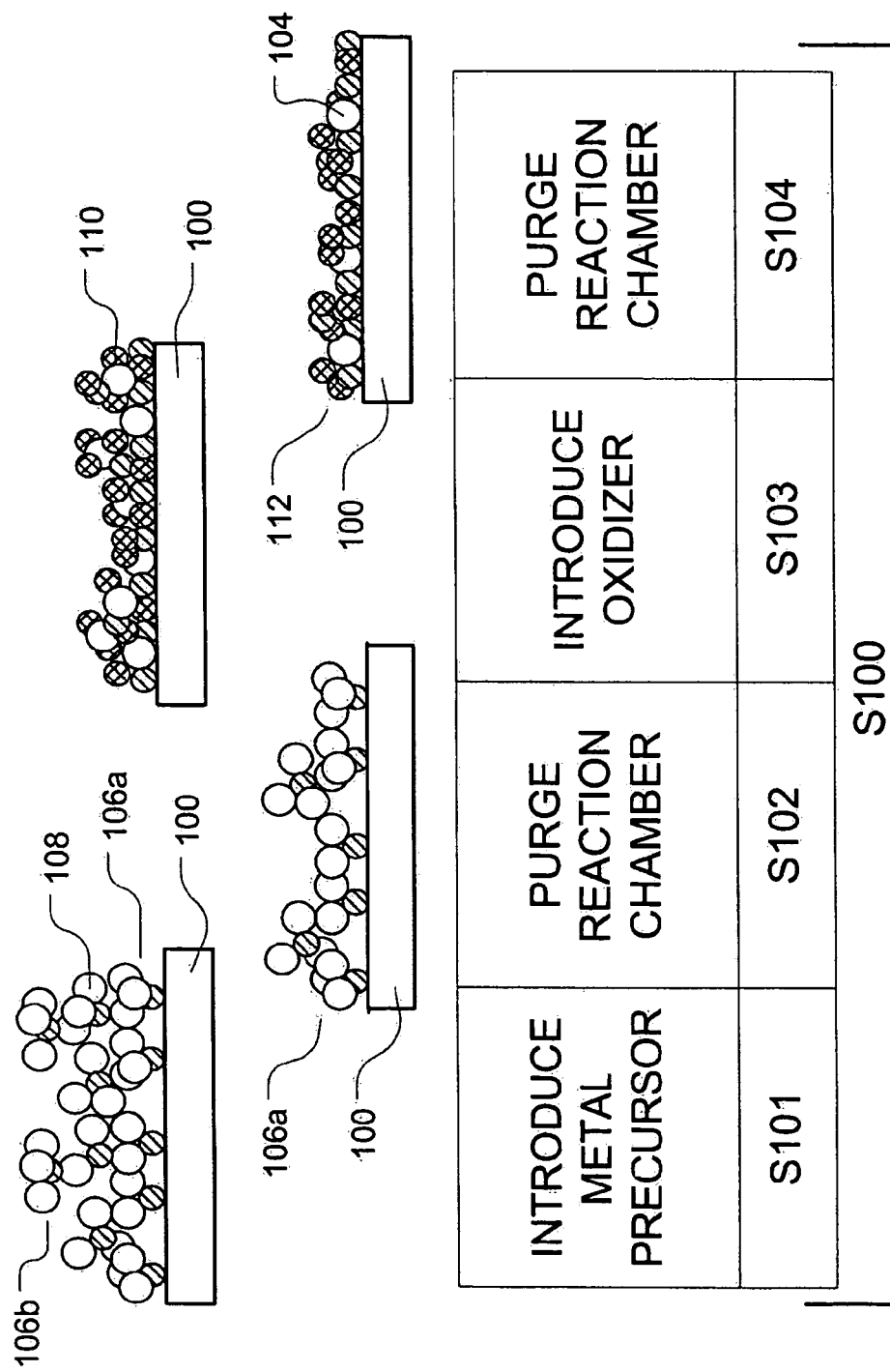
FIG. 8 illustrates the basic ALD deposition routine.

The basic ALD sequence S100 includes the step S101 of introducing a metal precursor 106 to form a chemisorbed layer 106a on the substrate 100, the step S102 of purging the remainder of the metal precursor 106b to leave the chemisorbed layer 106a, the step S102 of introducing an oxidizer 110 to react with the metal precursor and form the desired atomic scale metal oxide layer 112, including some residual organic contamination 104, and step S104 of purging the chamber to prepare for subsequent steps. As illustrated in FIG. 8, the basic ALD sequence S100 is then repeated as necessary to produce an intermediate HfO$_2$ layer, including n atomic scale hafnium oxide layers wherein n is at least about 4, having a target thickness of generally less than about 10 Å.

This intermediate layer is then treated with an oxidizer in step S200 to remove the majority of the carbon contaminants from the intermediate metal oxide film. Once the oxidizing treatment is complete and the reaction chamber has been purged to remove residual oxidant, if additional metal oxide thickness is required, the basic ALD sequence S100 can be repeated to prepare a new intermediate metal oxide film, again followed by an oxidizing treatment S200 until the target thickness is achieved for the dielectric layer.

Further, by performing these oxidizing treatments repeatedly on thinner intermediate metal oxide films, such as HfO$_2$ films, during the production of the final dielectric film reduces the level of carbon contamination throughout the entire film. Although as illustrated in FIG. 8, the basic ALD sequence is repeated twice between oxidizing treatments, those of ordinary skill in the art will appreciate that additional repetitions would be conducted in generally the same manner.

In the case of HfO$_2$, once the metal oxide layer has reached a sufficient thickness through the accumulation of individually oxidized intermediate layers, a top electrode may be formed to complete the capacitor. To reduce the likelihood or degree of crystallization in the HfO$_2$ film, the top electrode may be formed using an ALD process using a metal precursor such as TiCl$_4$ and a nitrogent such as NH$_3$ as to form a metal nitride layer such as TiN at temperatures generally below about 450° C.

A capping layer of silicon and germanium, SiGe, may be formed in a similar fashion using SiH$_4$ and GeH$_4$ precursors in a single wafer type CVD chamber at 420° C. The SiGe material may be doped during the formation process by adding phosphine, PH$_3$ to the reactant gas mixture during the deposition to obtain a dopant activated polysilicon-Ge layer useful as the top electrode without the need for a high temperature anneal. Other materials may be incorporated into the upper electrode as well, including tantalum, Ta, tantalum nitride, TaN, tungsten, W, tungsten nitride, W N and ruthenium, Ru, using conventional CVD deposition, sputter deposition or ALD techniques.

As will be appreciated, the exemplary embodiment of the LOT process disclosed above may be modified in various ways to provide for the introduction of additional oxidizers and/or nitrogents (compounds capable of forming nitrides and/or oxynitrides with metals and metal oxides) during the formation of the metal oxide dielectric layer. Portions of exemplary process sequences are illustrated in FIGS. 9A–9E in which various combinations of oxidants and, in some instances, nitrogents, are used to treat the intermediate metal oxide layers to produce a less contaminated and more robust dielectric film.

Similarly, the number of ALD atomic layers constituting a single intermediate layer and the number of intermediate layers required to produce a final dielectric layer having the required thickness may be easily adapted for the particular equipment, precursors and processes being utilized based on the exemplary embodiments described and illustrated herein. The exemplary process sequences illustrated in FIGS. 9A–E are not drawn to scale and should not be interpreted as teaching or suggesting the relative duration of the various process steps or exclude variations of the basic processes that can be arranged by those of ordinary skill in the art as guided by the present disclosure. Similarly, there is no requirement that the intermediate dielectric layers be of substantially uniform thickness, that the duration of and oxidizer used in the LOT process need be constant.

Figure 9A:
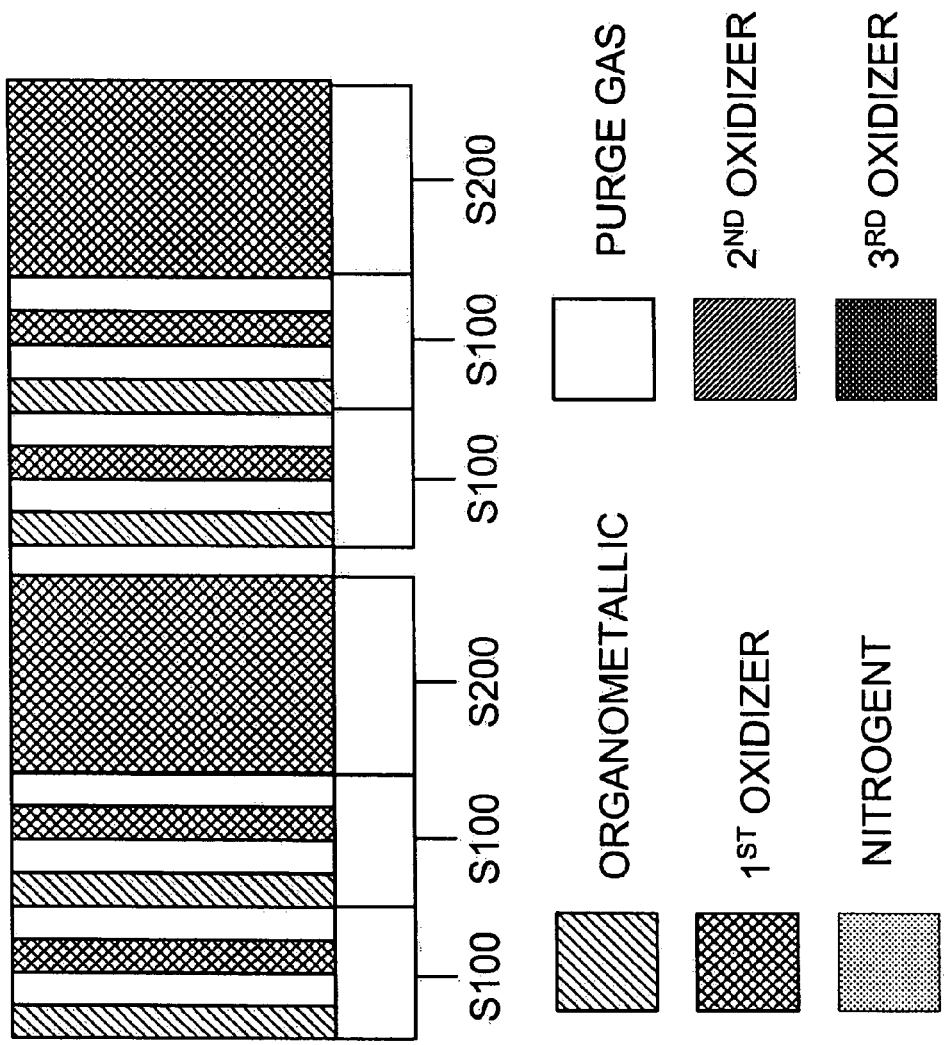
FIGS. 9A–E illustrate various exemplary embodiments of the method of forming a dielectric layer according to the invention.

As illustrated in FIG. 9A, an exemplary process according to the present invention may utilize a single oxidant for both the ALD deposition cycles and the oxidizing treatment of the intermediate metal oxide layers. As illustrated in FIG. 9A, a conventional application of this process would involve a series of deposition cycles S100, followed by a longer oxidation or flush cycle to reduce the level of organic contamination within the just-formed metal oxide layer. Following the flush cycle, the reactor is again purged and another series of deposition cycles S1100 may be initiated.

Figure 9B:
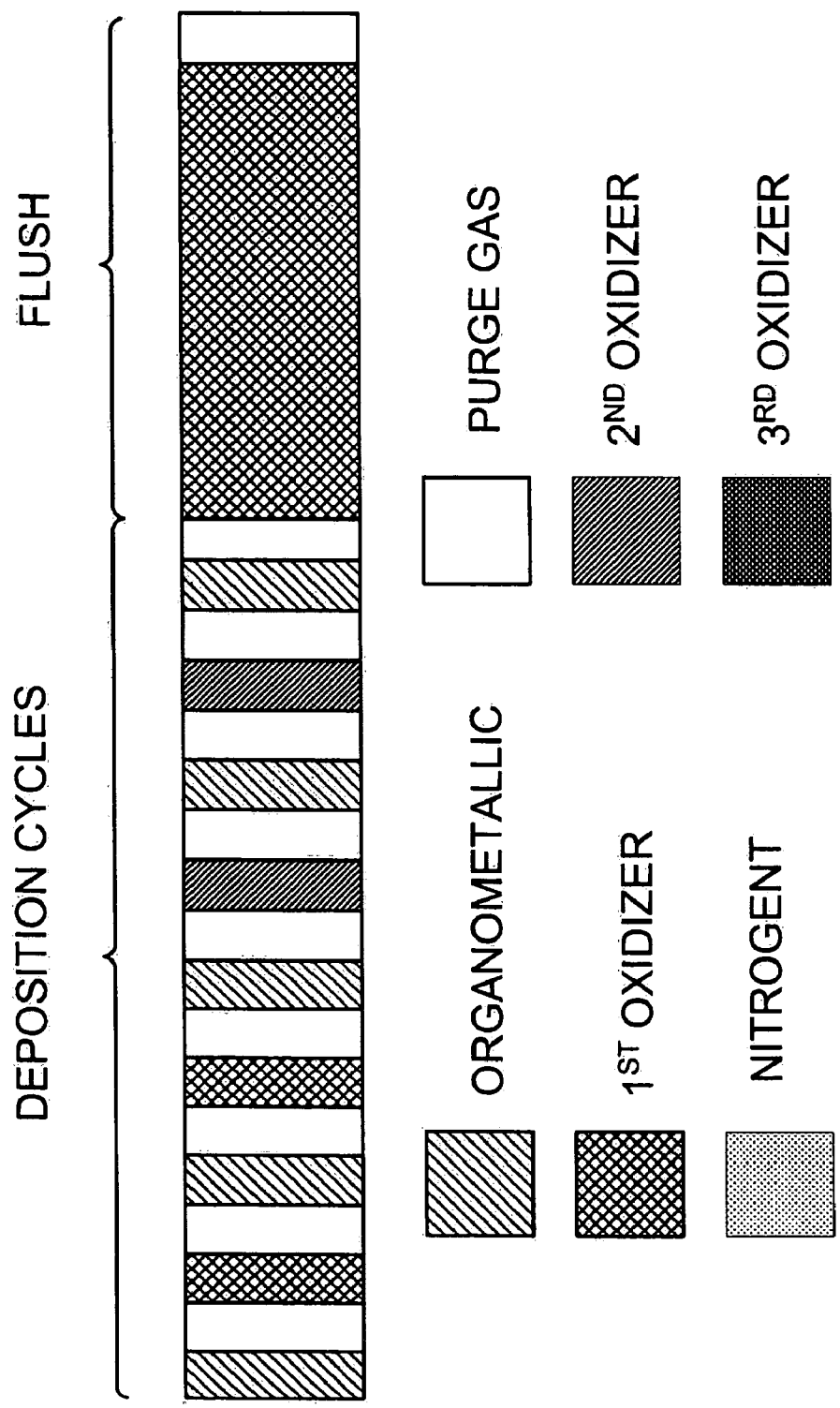
Figure 9C:
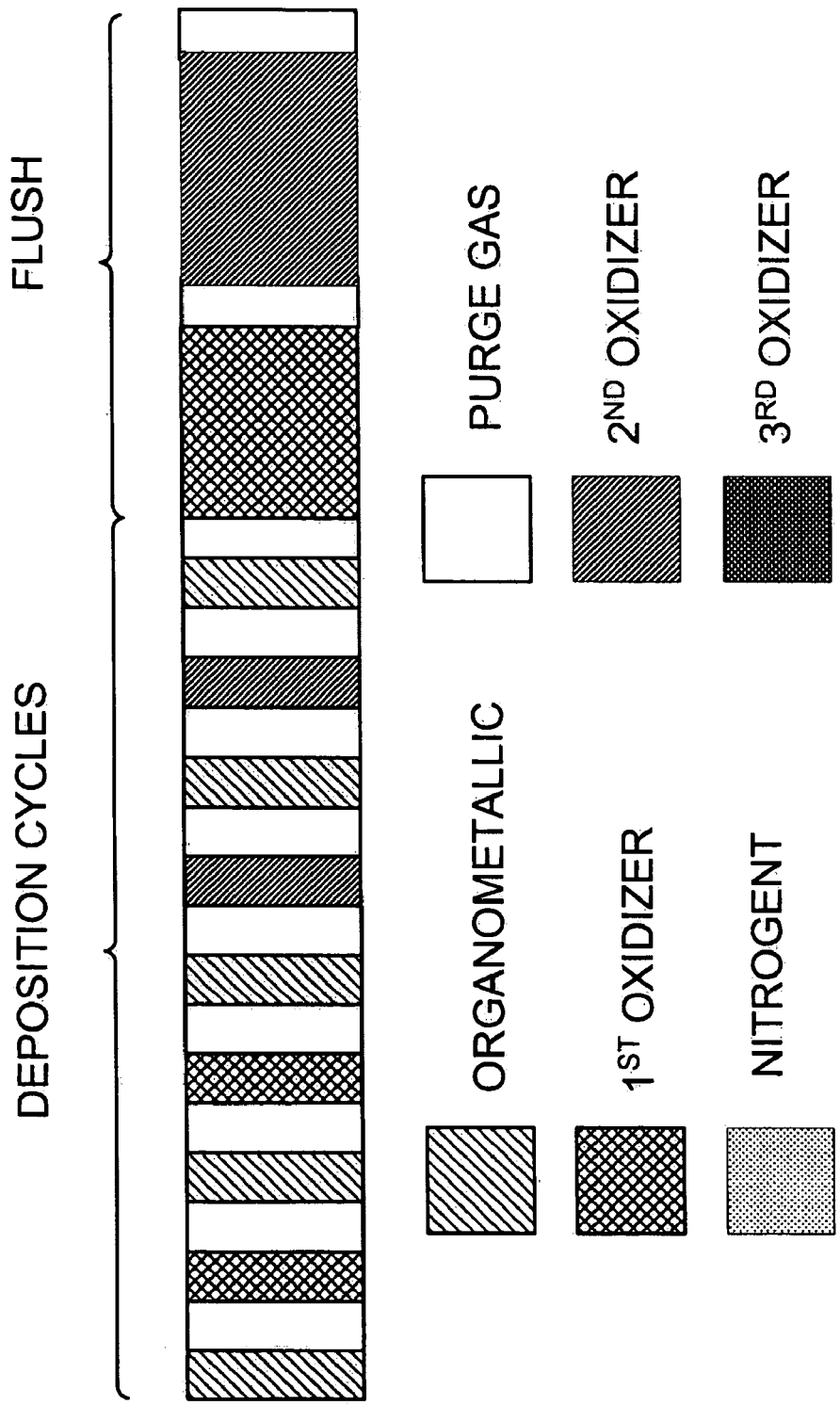

As illustrated in FIG. 9B, another exemplary process can be configured to utilize two different oxidants, i.e., a first oxidizer and a second oxidizer, during the deposition cycles, followed by a flush cycle that uses only one of the available oxidizers. As illustrated in FIG. 9C, another exemplary process can be configured to utilize two different oxidants, i.e., a first oxidizer and a second oxidizer, during both the deposition and flush cycles.

Figure 9D:
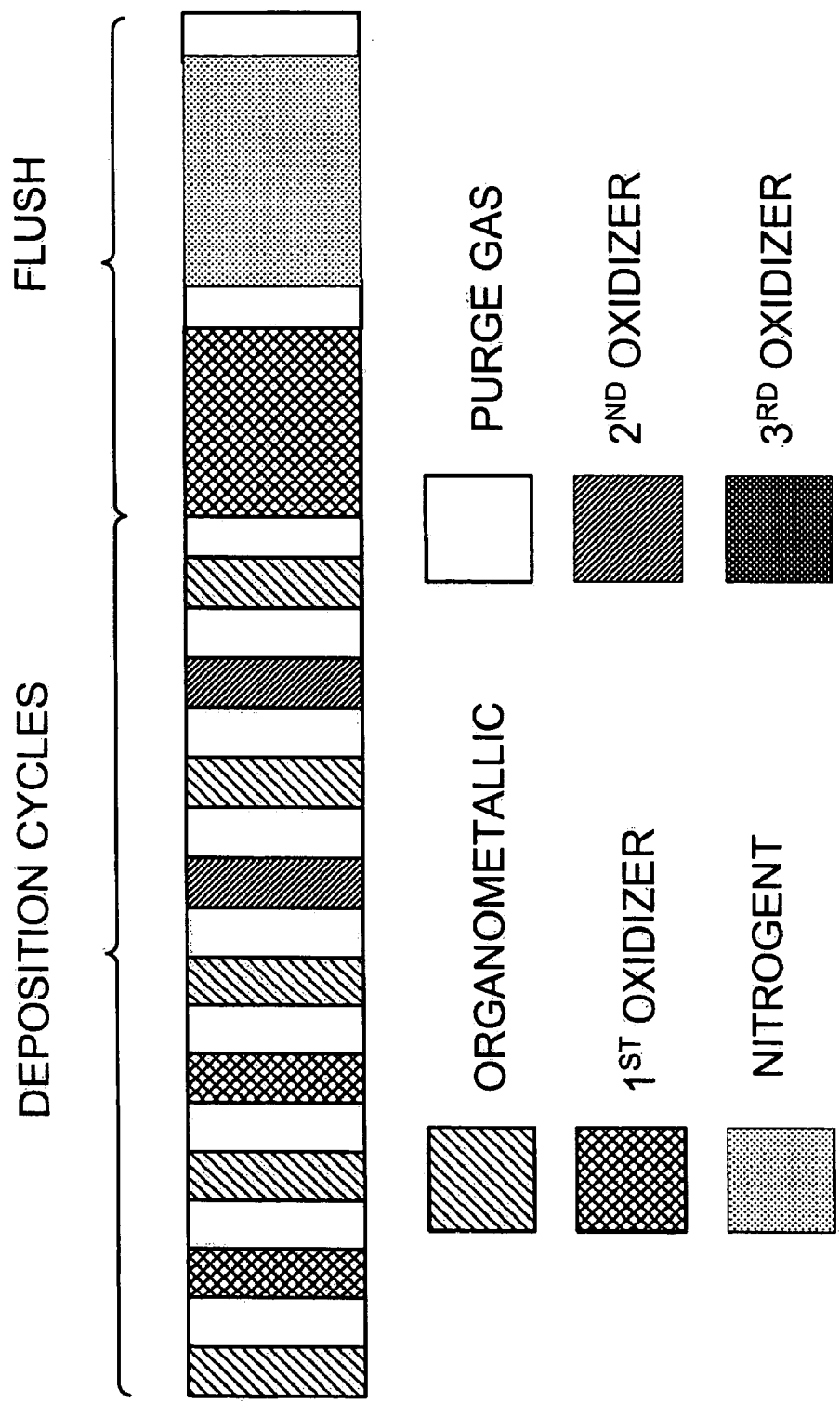
Figure 9E:
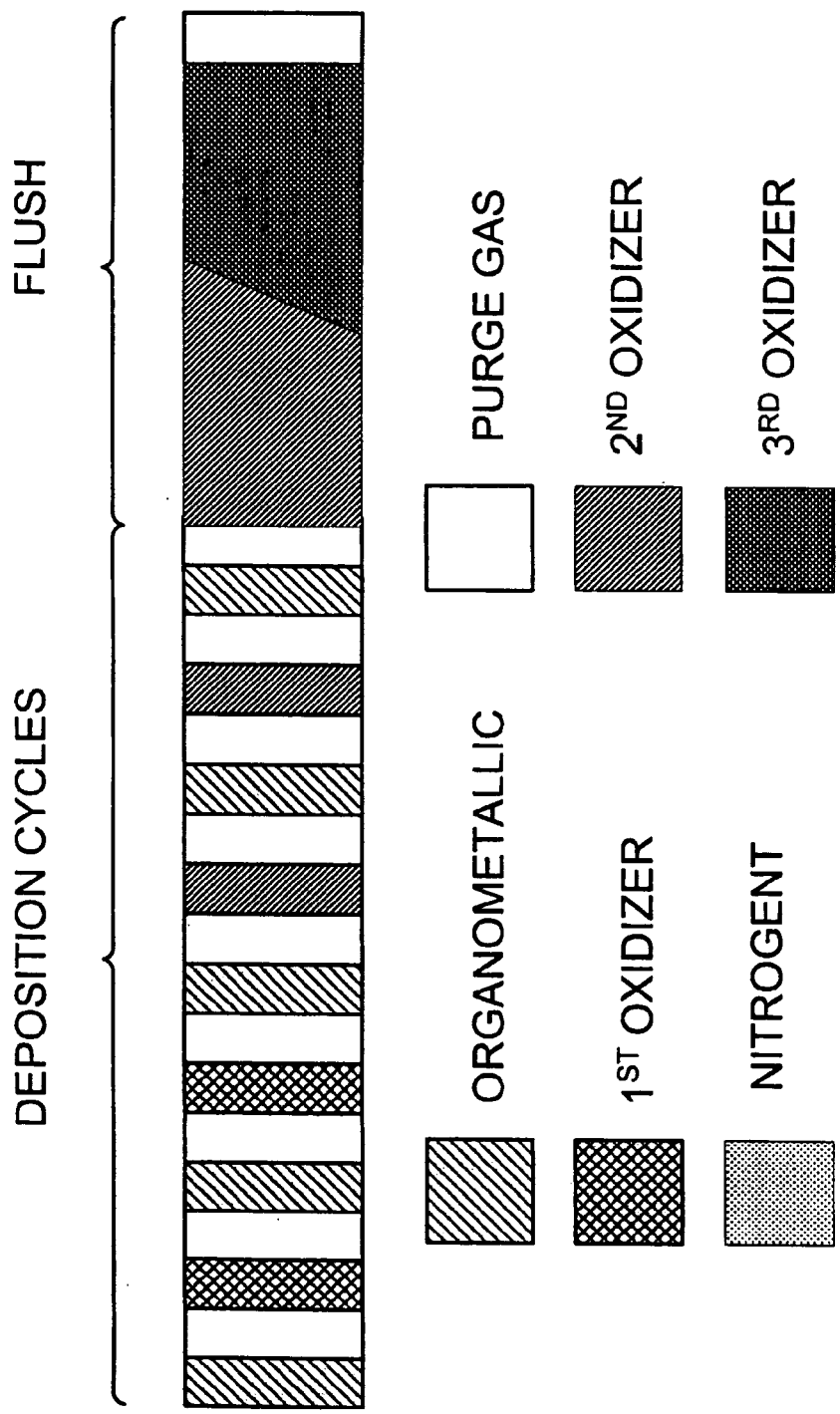

As illustrated in FIG. 9D, another exemplary process can be configured to include both an oxidizer and a nitrogent during the flush cycle to further modify the composition of the resulting metal oxide layer. As illustrated in FIG. 9E, another exemplary process can be configured to allow a combination of two or more (not shown) oxidizers to be used during the deposition (not shown) and/or flush cycles if the oxidizers are compatible with one another. As will be appreciated, the basic variations illustrated in FIGS. 9A–E can be further modified through the selection and sequencing of the various precursors, oxidizers and nitrogents introduced into the reaction chamber to obtain dielectric layers having wide range of structures and compositions.

Indeed, although perhaps not exceptionally convenient, the exemplary processes described above may be modified to provide a series of intermediate layers having increasing, decreasing or alternating thicknesses. Similarly, the exemplary processes may be modified to treat each intermediate layer with a different oxidant if so desired, so long as the intermediate dielectric layers are treated in a manner sufficient to remove a major portion of the carbon contamination within the film.

Although the invention has been described in detail with respect to a series of exemplary embodiments, those of ordinary skill in the art will appreciate that various changes to the materials and processes detailed above may be made without departing from the scope of the invention as defined by the following claims.

What is claimed is:

1. A method of forming a hafnium oxide layer on a substrate comprising:
    positioning the substrate in a vacuum chamber;
    forming a first atomic scale hafnium oxide layer by
        introducing an organic hafnium precursor into the vacuum chamber under conditions sufficient to form a chemisorbed layer of the organic hafnium precursor on the substrate;
        purging the reaction chamber to remove substantially all of the organic hafnium precursor not included in the chemisorbed layer;
        introducing a first oxidant into the vacuum chamber under conditions sufficient to cause the first oxidant to react with the chemisorbed layer to form hafnium oxide and reaction byproducts;
        purging the vacuum chamber to remove substantially all remaining first oxidant and a major portion of the reaction byproducts;
    forming additional atomic scale hafnium oxide layers by repeatedly
        introducing the organic hafnium precursor into the vacuum chamber under conditions sufficient to form a chemisorbed layer of the organic hafnium precursor on a previous atomic scale hafnium oxide layer;
        purging the reaction chamber to remove substantially all of the organic hafnium precursor not included in the chemisorbed layer;
        introducing the first oxidant into the vacuum chamber under conditions sufficient to cause the first oxidant to react with the chemisorbed layer to form hafnium oxide and reaction byproducts;
        purging the vacuum chamber to remove substantially all unreacted first oxidant and a major portion of the reaction byproducts to produce a hafnium oxide layer of thickness t including n atomic scale hafnium oxide layers, wherein $n \geq 4$; and
    treating the hafnium oxide layer with a second oxidant for a first flush period sufficient to reduce a level of organic contamination throughout substantially the entire thickness t of the hafnium oxide layer.

2. A method of forming a hafnium oxide layer on a substrate according to claim 1, further comprising:
    forming at least a second hafnium oxide layer on the hafnium oxide layer.

3. A method of forming a hafnium oxide layer on a substrate according to claim 1, wherein:
    the organic hafnium precursor is tetrakis ethyl methyl amino hafnium (TEMAH);
    the first oxidant includes at least one compound selected from a group consisting of $O_3$, $O_2$, $H_2O$, $H_2O_2$, $CO_2$, $N_2O$, $NO_2$, plasma $O_2$, remote plasma $O_2$, plasma $O_3$ and remote plasma $O_3$; and
    the second oxidant includes at least one compound selected from a group consisting of $O_3$, $O_2$, $H_2O$, $H_2O_2$, $CO_2$, $N_2O$, $NO_2$, plasma $O_2$, remote plasma $O_2$, plasma $O_3$ and remote plasma $O_3$.

4. A method of forming a hafnium oxide layer on a substrate according to claim 3, wherein:
    the first oxidant and the second oxidant are the same.

5. A method of forming a hafnium oxide layer on a substrate according to claim 1, further comprising:
    treating the hafnium oxide layer with a third oxidant for a second flush period.

6. A method of forming a hafnium oxide layer on a substrate according to claim 5, further comprising:
    purging the reaction chamber to remove substantially all of the second oxidant before treating the hafnium oxide layer with the third oxidant.

7. A method of forming a hafnium oxide layer on a substrate according to claim 1, further comprising:
    treating the hafnium oxide layer with an nitrogent for a second flush period after treating the hafnium oxide layer with the second oxidant.

8. A method of forming a hafnium oxide layer on a substrate according to claim 7, further comprising:
    purging the reaction chamber to remove substantially all of the second oxidant before treating the hafnium oxide layer with the nitrogent.

9. A method of forming a hafnium oxide layer on a substrate according to claim 1, wherein:
the organic hafnium precursor is introduced into the vacuum chamber at a pressure of about 0.1–10 torr and a temperature of about 200–400° C.

10. A method of forming a hafnium oxide layer on a substrate according to claim 1, wherein:
the first oxidant is $O_3$;
the second oxidant is selected from a group consisting of $O_3$, UV-O3, plasma $O_3$, plasma $O_2$, remote plasma O3, and remote plasma $O_2$; and
the first flush period is at least 60 seconds.

11. A method of forming a capacitor including a hafnium dioxide dielectric comprising:
forming a bottom electrode;
forming a barrier layer on the bottom electrode
forming a first atomic scale hafnium oxide layer on the barrier layer by
introducing an organic hafnium precursor into the vacuum chamber under conditions sufficient to form a chemisorbed layer of the organic hafnium precursor on the substrate;
purging the reaction chamber to remove substantially all of the organic hafnium precursor not included in the chemisorbed layer;
introducing a first oxidant into the vacuum chamber under conditions sufficient to cause the first oxidant to react with the chemisorbed layer to form hafnium oxide and reaction byproducts;
purging the vacuum chamber to remove substantially all remaining first oxidant and a major portion of the reaction byproducts;
forming additional atomic scale hafnium oxide layers by repeatedly
introducing the organic hafnium precursor into the vacuum chamber under conditions sufficient to form a chemisorbed layer of the organic hafnium precursor on a previous atomic scale hafnium oxide layer;
purging the reaction chamber to remove substantially all of the organic hafnium precursor not included in the chemisorbed layer;
introducing the first oxidant into the vacuum chamber under conditions sufficient to cause the first oxidant to react with the chemisorbed layer to form hafnium oxide and reaction byproducts;
purging the vacuum chamber to remove substantially all unreacted first oxidant and a major portion of the reaction byproducts
to produce a hafnium oxide layer of thickness t including n atomic scale hafnium oxide layers, wherein $n \geq 4$;
treating the hafnium oxide layer with a second oxidant for a first flush period sufficient to reduce a level of organic contamination throughout substantially the entire thickness t of the hafnium oxide layer; and
forming a top electrode to complete the capacitor.

12. A method of forming a capacitor with a hafnium dioxide dielectric according to claim 11, wherein forming the barrier layer further comprises:
nitriding a surface portion of the bottom electrode prior to forming the hafnium oxide layer.

13. A method of forming a capacitor with a hafnium dioxide dielectric according to claim 11, wherein forming the top electrode further comprises:
forming a titanium nitride layer on the hafnium oxide layer; and
forming a tungsten layer on the titanium nitride layer.

14. A method of forming a capacitor with a hafnium dioxide dielectric according to claim 12, wherein nitriding the bottom electrode utilizes a rapid thermal nitridation process.

15. A method of forming a capacitor with a hafnium dioxide dielectric according to claim 11, wherein:
the first oxidant and the second oxidant are the same.

16. A method of forming a hafnium oxide layer on a substrate according to claim 11, further comprising:
treating the hafnium oxide layer with a third oxidant for a second flush period.

17. A method of forming a hafnium oxide layer on a substrate according to claim 16, further comprising:
purging the reaction chamber to remove substantially all of the second oxidant before treating the hafnium oxide layer with the third oxidant.

18. A method of forming a hafnium oxide layer on a substrate according to claim 11, further comprising:
treating the hafnium oxide layer with an nitrogent for a second flush period after treating the hafnium oxide layer with the second oxidant.

19. A method of forming a hafnium oxide layer on a substrate according to claim 18, further comprising:
purging the reaction chamber to remove substantially all of the second oxidant before treating the hafnium oxide layer with the nitrogent.

20. A method of forming a hafnium oxide layer on a substrate according to claim 11, wherein:
the first oxidant is $O_3$;
the second oxidant is selected from a group consisting of $O_3$, plasma $O_3$, plasma $O_2$ and remote plasma $O_2$; and
the first flush period is at least 60 seconds.

21. A method of manufacturing a semiconductor device including a capacitor having a hafnium dioxide dielectric comprising:
forming a bottom electrode on a semiconductor substrate;
forming a barrier layer on the bottom electrode
forming a first atomic scale hafnium oxide layer on the barrier layer by
introducing an organic hafnium precursor into the vacuum chamber under conditions sufficient to form a chemisorbed layer of the organic hafnium precursor on the substrate;
purging the reaction chamber to remove substantially all of the organic hafnium precursor not included in the chemisorbed layer;
introducing a first oxidant into the vacuum chamber under conditions sufficient to cause the first oxidant to react with the chemisorbed layer to form hafnium oxide and reaction byproducts;
purging the vacuum chamber to remove substantially all remaining first oxidant and a major portion of the reaction byproducts;
forming additional atomic scale hafnium oxide layers by repeatedly
introducing the organic hafnium precursor into the vacuum chamber under conditions sufficient to form a chemisorbed layer of the organic hafnium precursor on a previous atomic scale hafnium oxide layer;
purging the reaction chamber to remove substantially all of the organic hafnium precursor not included in the chemisorbed layer;
introducing the first oxidant into the vacuum chamber under conditions sufficient to cause the first oxidant to react with the chemisorbed layer to form hafnium oxide and reaction byproducts;

purging the vacuum chamber to remove substantially all unreacted first oxidant and a major portion of the reaction byproducts to produce a hafnium oxide layer of thickness t including n atomic scale hafnium oxide layers, wherein n≧4;

treating the hafnium oxide layer with a second oxidant for a first flush period sufficient to reduce a level of organic contamination throughout substantially the entire thickness t of the hafnium oxide layer;

forming a top electrode to complete the capacitor; and completing the manufacture of the semiconductor device without exposing the capacitor to a temperature sufficient to cause crystallization of the hafnium oxide layer.

22. A method of manufacturing a semiconductor device including a capacitor with a hafnium dioxide dielectric according to claim 21, wherein:

the capacitor is not exposed to a temperature above about 500° C.

23. A method of manufacturing a semiconductor device including a capacitor with a hafnium dioxide dielectric according to claim 21, wherein:

the capacitor is not exposed to a temperature above about 550° C.

24. A method of manufacturing a semiconductor device including a capacitor with a hafnium dioxide dielectric according to claim 21, wherein forming the top electrode includes:

forming a titanium nitride layer by atomic layer deposition using $TiCl_4$ and $NH_3$ as reactant gases at a temperature of not more than about 450° C.

25. A method of manufacturing a semiconductor device including a capacitor with a hafnium dioxide dielectric according to claim 24, wherein forming the top electrode further includes:

forming a tungsten layer on the titanium nitride layer.

26. A method of manufacturing a semiconductor device including a capacitor with a hafnium dioxide dielectric according to claim 24, wherein forming the top electrode further includes:

forming a silicon-germanium capping layer on the titanium nitride layer using $SiH_4$ and $GeH_4$ as reactant gases in a CVD process operating at a temperature of not more than about 420° C.

27. A method of manufacturing a semiconductor device including a capacitor with a hafnium dioxide dielectric according to claim 21, wherein:

the first oxidant is $O_3$;

the second oxidant is selected from a group consisting of $O_3$, plasma $O_3$, plasma $O_2$ and remote plasma $O_2$; and the first flush period is at least 60 seconds.

* * * * *